OPTICAL COATING AND ASSEMBLY USED AS A BAND PASS INTERFERENCE FILTER REFLECTING IN THE ULTRAVIOLET AND INFRARED

Filed May 17, 1961 2 Sheets-Sheet 1

INVENTOR.
Alfred J. Thelen.
BY
Flehr and Swain.
ATTORNEYS.

April 19, 1966 A. J. THELEN 3,247,392
OPTICAL COATING AND ASSEMBLY USED AS A BAND PASS INTERFERENCE FILTER REFLECTING IN THE ULTRAVIOLET AND INFRARED
Filed May 17, 1961 2 Sheets-Sheet 2
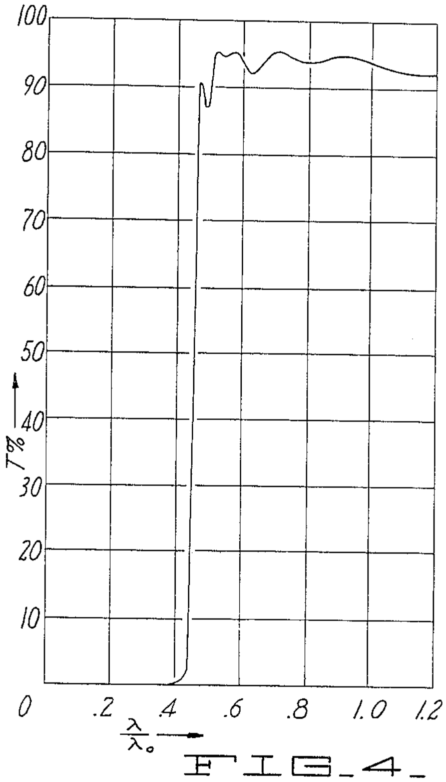
FIG. 4
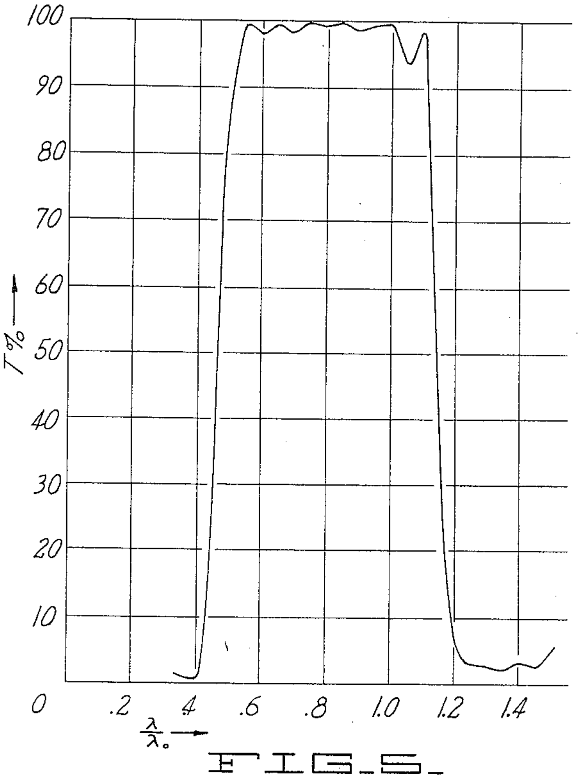
FIG. 5
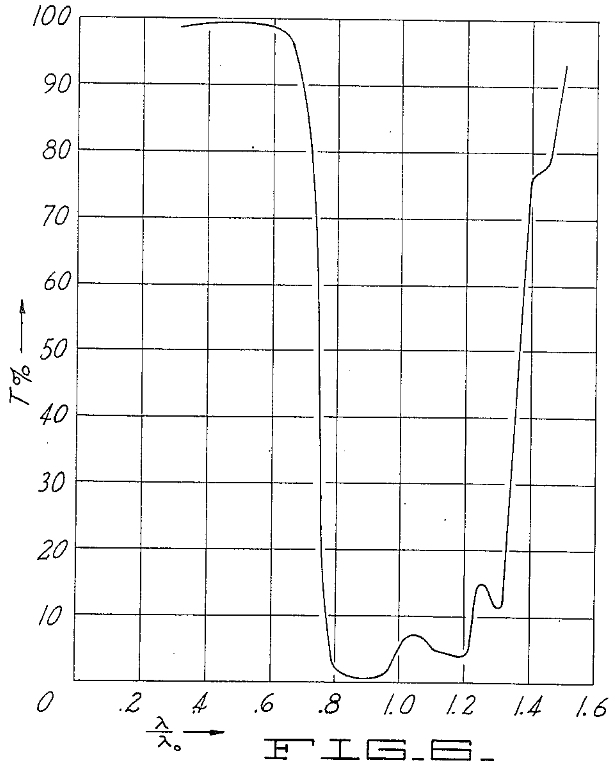
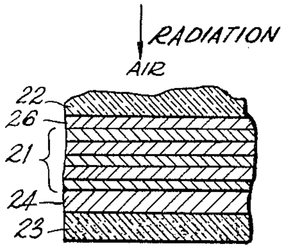
FIG. 7
INVENTOR.
Alfred J. Thelen.
BY
Flehr and Swain
ATTORNEYS.

United States Patent Office 3,247,392
Patented Apr. 19, 1966

3,247,392

OPTICAL COATING AND ASSEMBLY USED AS A BAND PASS INTERFERENCE FILTER REFLECTING IN THE ULTRAVIOLET AND INFRARED

Alfred J. Thelen, Santa Rosa, Calif., assignor to Optical Coating Laboratory, Inc., Santa Rosa, Calif., a corporation of Delaware Filed May 17, 1961, Ser. No. 110,781
25 Claims. (Cl. 250—226)

This invention relates to an optical coating and assembly used as a band pass interference filter and more particularly to an optical coating and assembly used as a band pass interference filter reflecting in the ultraviolet and infrared regions and which has a particularly wide transmission band.

In the use of the silicon p-n junction photovoltaic cell, commonly known as the solar cell, for the conversion of solar energy into electrical power, it is well known that the power output of the cell decreases with increasing temperature. In other words, the silicon solar cell loses its conversion efficiency as the temperature of the solar cell increases. In one of the primary applications of silicon solar cells, they are used to supply auxiliary power in space vehicles. Such cells absorb most of the solar energy received but only 10 percent or less of this energy is converted into electricity so that the remainder heats the cells and the space vehicle. This heat raises the cell temperature and serves to reduce the energy conversion efficiency even further. The only way to dissipate the heat in space is by radiation. Consequently, the cell temperature is determined mainly by the optical characteristics of the solar cell surface. In general, a silicon solar cell responds to radiation between .40 micron to 1.1 microns. Thus, solar energy outside of this band is not converted into electricity and when absorbed only heats up the solar cell. Many attempts have been made to reflect the undesired solar energy away from the solar cell so that this energy will not heat up the solar cell to maintain the solar cell at an efficient operating temperature. However, considerable difficulty has been previously experienced in this regard because of the wide band represented by the .40 to the 1.1 micron response range of the solar cell. For that reason, there has heretofore not been available a filter which would reflect at both sides of this wide band. There is, therefore, a need for an interference filter which has a pass band which is substantially the same as the response band of the silicon solar cell.

In general, it is an object of the present invention to provide an optical coating and assembly for use as an interference filter which has a wide pass band, or, in other words, has a wide transmission region.

Another object of the invention is to provide an optical coating of the above character which has a ratio of 4:1 for the peak wavelengths of two adjacent reflectance bands.

Another object of the invention is to provide an optical coating of the above character which utilizes three different coating materials.

Another object of the invention is to provide an optical coating of the above character in which the three materials are utilized in a particular periodic combination.

Another object of the invention is to provide an optical coating of the above character in which each layer of the coating has the same optical thickness.

Another object of the invention is to provide an optical coating of the above character in which the second and third order reflectance bands are suppressed.

Another object of the invention is to provide an optical coating of the above character which has general applications as well as a particular application for use as a heat reflector for solar cells.

Another object of the invention is to provide an optical coating of the above character which can be combined with other coatings to obtain additional desired characteristics.

Another object of the invention is to provide an interference filter of the above character which can be readily combined with a blue reflector to reflect ultraviolet.

Another object of the invention is to provide an interference filter of the above character which can be combined with a conventional heat reflector having a 3:1 design to produce a reflection band of increased width.

Additional objects and features of the invention will appear from the following description in which the preferred embodiments are set forth in detail in conjunction with the accompanying drawings.

Referring to the drawings:

FIGURE 4 is a graph showing the transmission characteristics of a conventional ultraviolet reflecting coating.

FIGURE 5 is a graph of a combination coating combining the characteristics of the coating shown in FIGURE 3 and the coating shown in FIGURE 4 to give the transmission characteristic of an ultraviolet and an infrared reflecting coating.

FIGURE 6 is a graph showing the transmission characteristics of another combination coating in which my coating shown in FIGURE 3 has been combined with a conventional heat reflecting coating to provide a heat reflecting coating having a relatively wide transmission band.

FIGURE 7 is a greatly enlarged sectional view of an optical assembly utilizing my invention.

In general, my optical coating consists of three different coating materials A, B and C arranged in layers to provide a structure which has a periodicity of ABCBA. Each of the layers has an optical thickness of one-quarter of the design wave length. This combination makes it possible to suppress the second and third order reflectance bands so that only first and fourth order reflectance bands remain. This optical coating therefore can serve as a filter having a very wide transmission band which reflects substantially outside of the transmission band. The optical coating has a transmission band which lends itself to use as a solar cell reflector. In addition, it has characteristics which are particularly adapted for general filter applications wherein it is desired to pass a wide band and reject outside of the band. The coating can also be used as a heat reflector when utilized in combination with other heat reflecting coatings. This makes it possible to obtain a very wide reflection while retaining the desired transmission band.

Figure 1:
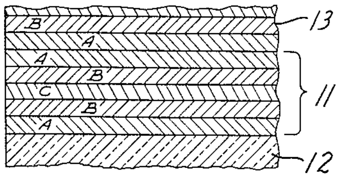
FIGURE 1 is a greatly enlarged sectional view of a transparent substrate provided with an optical coating in accordance with the present invention.

More in particular, my optical coating and assembly as shown in FIGURE 1 consists of a coating or filter which is generally designated at 11 which is deposited on a suitable transparent support or substrate 12. The coating or filter 11 consists of a plurality of nonmetallic superposed interference layers 13 of negligible absorption and of different refractive indices which are deposited one upon the other as shown in FIGURE 1 upon one of the surfaces of the substrate 12. Three different materials identified as A, B and C are utilized for the different layers 13 and are arranged with a periodicity of ABCBA as shown particularly in FIGURE 1.

Each of the layers has an optical thickness of one-quarter wave length. As is well known to those skilled in the art, the thickness of such coatings is normally in the order of magnitude of the wave length of light for which the filter is to be used. This thickness is normally referred to as optical thickness and is the physical thickness multiplied by the index of refraction of the material. Thus, the optical thickness of the coating or filter is normally described in fractions of wave length of the light for which the filter is to be used. Each coating or filter normally has a design wave length and the optical thickness is specified as a fraction of this design wave length.

In the present filter, I have found it desirable to utilize layers each having a one-quarter wave length. However, it will be noted that where two periods join, there are two quarter lengths of the same material (A, A) which abut. Therefore, in effect there is a layer which has a thickness of one-half wave length. However, basically, each periodic structure is comprised of layers of equal optical thickness, that is, one-quarter wave length.

It should be realized that any number of periodic structures can be placed on the substrate 12 depending upon the quality of coating or filter desired. The lowest number of layers is five, making up one periodic structure. The next is two periodic structures with nine layers, three periodic structures with 13 layers, four periodic structures with 17 layers, and so forth. Because of the periodicity utilized, the first period consists of five layers, whereas each succeeding period only consists of four layers. This is because there are two identical materials forming one layer ending one period and starting the next period. By experience, I have found that it is desirable to at least utilize at least three periods to obtain a filter having good efficiency. However, it is normally desirable to utilize additional periods. For example, in one such filter utilized as a solar reflector, 29 layers were used comprising seven periodic structures.

Figure 2:
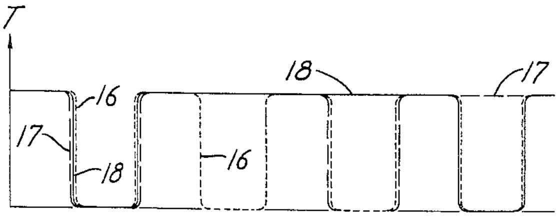
FIGURE 2 is a graph used for designing my optical coating showing the reflectance peaks of a general stack, a quarter wave stack and of the desired stack or coating.

In designing a band pass interference filter of the above character, the following should be taken into consideration. In FIGURE 2, there is a drawing showing the different reflection peaks in which the ordinate is the transmittance and the abscissa is the wave number. The wave number is defined as $\lambda_0/\lambda$, where $\lambda_0$ is the design wave length and $\lambda$ is the wave length.

The curve 16 in FIGURE 2 shows the different reflection peaks which would be given by a general stack with any periodic combination of materials. Reflection peaks of the first order, second order, third order, and fourth order are obtained as shown in FIGURE 2. It will be noted that the first order peak appears at the left hand side of the drawing in FIGURE 2. This is true because the abscissa is in the reciprocal of the wave length. Another curve 17 is shown in FIGURE 2 for a quarter-wave stack of a conventional type. This curve 17 has a reflection peak at the first order, no reflection peak at the second order, a reflection peak at the third order, and none at the fourth order. In curve 18, FIGURE 2, is shown the curve for the desired stack which has a reflection peak at the first order and a reflection peak at the fourth order but no reflection peaks at the second and third orders.

Epstein, in his article entitled "Improvements in Heat Reflecting Filters," published in May 1955, in the Journal of the Optical Society of America, Vol. 45, No. 5, pages 361–362 established that it is possible to suppress two bands of different wave lengths by using a structure having a periodicity of ABCBA. R. B. Muchmore, in an article published in 1948 in the Journal of the Optical Society of America, Vol. 38, page 20, established that it is possible to obtain anti-reflection effects whenever the indices of refraction and the thicknesses are related by the following formula:

$$\tan^2 k_1d_1=\frac{(n_1n_2-n_0^2)}{n_1^2-\frac{n_2}{n_1}n_0^2}\ \text{if}\ n_1n_2=n_3n_0 \qquad (1)$$

where $$k_1=\frac{2\pi}{\lambda}-n_1$$

$d_1$=physical thickness
$\lambda$=wave length
$n_0$=index of refraction of medium (air)
$n_1$=index of refraction of the coating next to medium
$n_2$=index of refraction of the coating
$n_3$=index of refraction of the substrate The above equation specifies how it is possible to obtain two coatings having anti-reflections at two wave lengths. This formula defines the thicknesses of these coatings and the indices of refractions required in order to match a medium and a substrate for anti-reflection purposes. The formula states that the tangent squared of an angle which has the optical thickness and the wave length of these coatings must be equal to an expression which uses the indices or refraction of the coating and its surroundings, that is, the substrate and the medium in which it is to be used. Thus, this formula determines the thicknesses of the layers as a function of the indices of refraction. However, before this is true, the index of refraction of the first layer multiplied by the index of refraction of the second layer must be equal to the index of refraction of the substrate multiplied by the index of refraction of the medium.

Also, the thickness of the two coatings must be equal. This is set forth in the equation below.

$$k_1d_1=k_2d_2$$

where $$k_1\frac{2\pi}{\lambda}n_1\ \text{and}\ k_2\frac{2\pi}{\lambda}n_2 \qquad (2)$$

are the optical thickness of the coating and $d_1$ and $d_2$ are the physical thicknesses of the coatings.

By these equations, it can be found that since the tangent is squared, plus or minus the tangent of the angle are solutions. Thus, if the angle $k_1d_1$ is equal to $\alpha$, there is a solution for $\pi=\alpha$. In other words, it can be stated that $$\frac{\lambda_1}{\lambda_2}=\frac{\pi-k_1d_1}{k_1d_1}=>k_1d_1=\frac{\pi}{1+\frac{\lambda_R}{\lambda_B}} \qquad (3)$$

where $\lambda_R$ and the $\lambda_B$ refer to the wave length of the red and blue curves 17 and 18 in FIGURE 2.

A ratio of wave length can be established from the fact that the tangent has these two solutions. Since it is desired to eliminate the second and third order reflectance bands, a ratio of 2:3 is selected. Thus, $$\frac{\lambda_R}{\lambda_B}=\frac{2}{3}=>k_1d_1=\frac{180}{1.66}=180^\circ-72^\circ \qquad (4)$$

Tangent 72°=3.0777
Tangent squared=9.4722

This value of 9.4722 is placed in the formula which interrelates the indices of refraction of the desired coatings as set forth below.

$$9.4722=\frac{n_1n_2-n_0^2}{n_1^2-n_0^2\frac{n_2}{n_1}} \qquad (5)$$

Then, taking this formula and substituting for $n_0$ from the equation $n_1n_2=n_0n_3$, we obtain the following $$9.4722=\frac{n_1n_2\left(n_3-\frac{n_1n_2}{n_3}\right)}{n_1^2n_3\frac{n_1n_2}{n_3}n_2^2}=\frac{n_2(n_3^2-n_1n_2)}{n_1n_3^2-n_2^3} \qquad (6)$$

The above formula gives the interrelation between the indices of refraction of the three materials to be utilized. In this formula it is assumed that there are two coatings utilized and a substrate. However, it is possible to utilize this same formula by assuming that the substrate is actually another coating and that the formula is valid for determining the indices of refraction of a plurality of coatings omitting the substrates and the mediums.

However, it should be pointed out that the index of refraction of the substrate and of the medium deserve independent consideration with which we are not concerned in the present invention. The primary consideration is that I am suppressing the second and third order reflectance bands, and, therefore, this has nothing to do with the substrate or the medium utilized. However, it is well known to those skilled in the art that other considerations must be taken into account when matching coatings to substrates as, for example, the rates of thermal expansion of the substrate with respect to the coatings or amount of peak transmission, etc. As pointed out above, the matching of the coatings to the substrate and to the medium involves considerations separate and independent from the present invention.

In utilizing the Formula 6 to determine the indices of refraction of the three different coatings, it is normally desirable to choose one material having a high index of refraction and another material having a low index of refraction. For example, a material having a relatively low index of refraction well known to those skilled in the art is magnesium fluoride, $MgF_2$, which has an index of refraction of 1.38. A material which has a relatively high index of refraction is titanium dioxide, $TiO_2$, which has an index of refraction of 2.30. Inserting these two values into the formulas for $n_1$ and $n_3$, respectively, the following is obtained:

$$9.4722=\frac{n_2(5.29-1.38\cdot n_2)}{1.38\cdot 5.29-n_2^3} \qquad (7)$$

In this manner, it is possible to obtain a third order equation for the index of refraction of the material having an index of refraction $n_2$. Transposing this equation by dividing the numerator with 9.4722 we have $$-n_2^3+7.3002=.5585\ n_2-.1457\ n_2^2 \qquad (8)$$

Then rearranging the equation, we have $$n_2^3-.1457\ n_2^2+.5585\ n_2-7.3002=0 \qquad (9)$$

Solving this cubic equation, we obtain the real number of approximately 1.9 which when substituted in the equation gives the following:

$$6.859-.5260+1.06115-7.3002 =+.0922 \text{ where } n_2=1.9 \qquad (10)$$

Thus we find that this second material can have an index of refraction of 1.9. A suitable material which has an index of refraction of 1.9 is lanthanum oxide $La_2O_3$.

I have found that this combination of magnesium fluoride, titanium oxide and lanthanum oxide works very satisfactorily on glass used as a substrate. However, I have found that it does not work as well when quartz is used as the substrate primarily because of the magnesium fluoride. Therefore, with quartz I have found it desirable to utilize silicon dioxide, $SiO_2$, which has an index of refraction of 1.56 as a substitute for the magnesium fluoride. Inserting this in the Formula 6 for $n_1$ and then solving for $n_2$ we arrive at an index of refraction of 1.98. A material having such an index of refraction or approximately such an index of refraction is then utilized for the coating for use with quartz as a substrate.

From the foregoing it can be seen that I have derived a single formula which interrelates the three indices of refraction of the three different coatings utilized in my filter.

The application of the various coatings on a substrate is well known to those skilled in the art. In general, it consists of vacuum depositing the coatings in a high vacuum of approximately .1 micron of mercury. The thickness of each layer is determined in a manner well known by those skilled in the art during the deposition. Prior to deposition in the coating machine the substrate is normally cleaned by mechanical means and by electron bombardment. Thereafter, the substrate is heated in a high vacuum after which the coatings are deposited one layer after the other until the necessary layers have been laid down to obtain the desired interference pattern.

Figure 3:
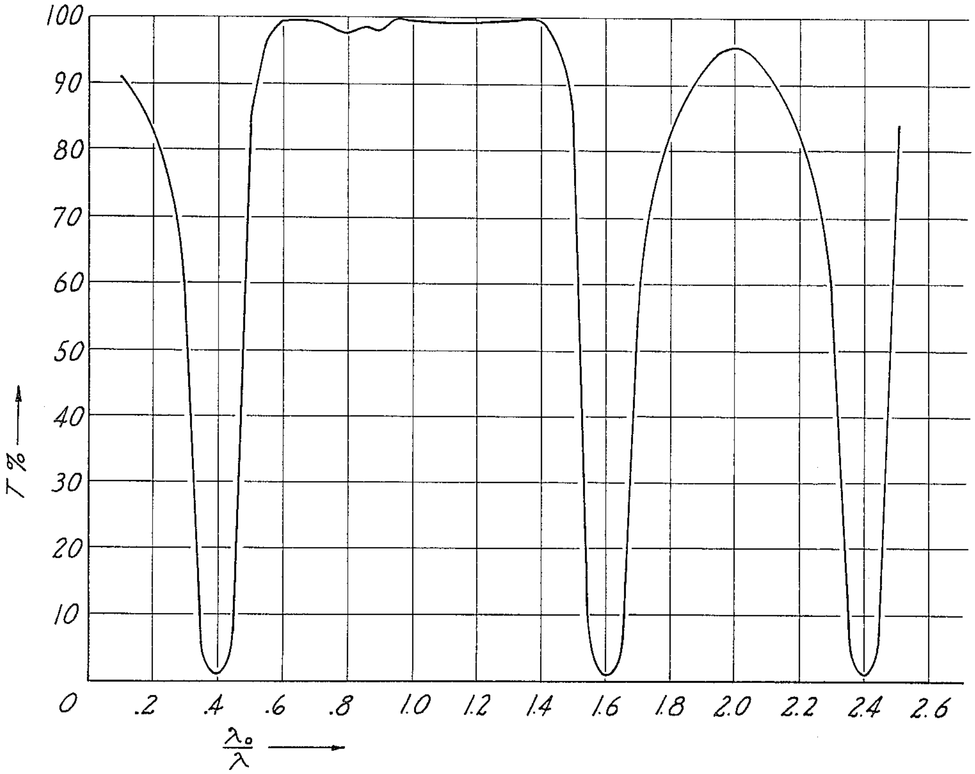
FIGURE 3 is a graph showing the transmission and reflection characteristics of a coating designed in accordance with the present invention.

In FIGURE 3, I have shown a curve obtained from a coating design made in accordance with the above formula. The data is presented in terms of transmittance vs. wave number. Wave number is defined as $\lambda_0/\lambda$, where $\lambda_0$=the design wavelength and where $\lambda$=the wave length. The design wave length is equal to the midpoint between the second and third order reflectance bands which it is desired to eliminate. From the curve in FIGURE 3, it can be seen that the transmission band extends over a wide region and that the ratio of the wavelengths at the first two adjacent reflectance peaks is 1.6:.4 or 4:1. This coating as discussed previously suppresses the second and third order reflection bands. As also can be seen from the curve there is a sharp differentiation between the transmission and the reflectance bands of the coating.

Normally, each additional period utilized in the coating increases the reflectivity and the reflectivity approaches closer and closer to 100 percent as additional periods are added to the coating. In the transmission region this same effect is not obtained by the addition of additional coatings because of an interference type action which occurs to provide secondary, minimums and maximums which do not increase in magnitude but which increase in number and height. These minimums and maximums are determined by the match of the substrate and the medium through the coating. Each coating combination has an equivalent index of refraction. This index of refraction does not change as additional periods are added or subtracted from the coating and does have an approximate continuous function. Normally, by choosing the proper combination of materials ABC in the combination of the coating, the best match to the substrate and to the medium can be obtained. If a suitable match cannot be obtained in this manner, it may be necessary to utilize a matching coating to match the substrate to the coating and the coating to the medium.

As can be seen from FIGURE 3, the coating has peak reflections which are at a wave length which has a ratio of 4:1. This determines the band width of the coating which is determined by the geometry of the period utilized. Thus, the band width of this coating cannot be varied substantially without the use of another coating. It is readily apparent that such a coating can serve in many general filter applications where it is desired to pass a wide band and reject everything outside of the band.

The coating also has additional applications and in particular for use as a coating for improving the efficiency of silicon solar cells. As pointed out above, the efficiency of silicon solar cells for the conversion of solar energy into electrical energy decreases rapidly with increasing cell temperature. Consequently, it is very important to keep the operating temperature of the solar cells as low as possible. My new coating particularly lends itself to this application because it has a band pass corresponding to these spectral response curves of a silicon solar cell. It is well known to those skilled in the art that solar energy below .4 micron and above 1.1 microns contribute very little to power conversion in the solar cell. It therefore follows that this energy can be reflected away from the cell to thereby reduce the average absorptivity without reducing the solar power available for power conversion. This unwanted energy can be kept away from the solar cell in two ways. One, the silicon solar cells can be illuminated with a mirror which has a coating to only reflect energy between .4 micron and 1.1 microns and two, covering or coating the solar cell with a filter which reflects the energy below .4 micron and above 1.1 microns.

From the curve shown in FIGURE 3 it can be seen that if the peak reflection in the infrared or "red" is at 1.6 microns, the peak reflection in the ultraviolet or "blue" is at .4 micron which approximately gives the 1:4 ratio. These figures may not give the ratio exactly for all coatings made in accordance with my invention because of the fact that the index of refraction changes slightly with the wave length which causes a change in the optical thickness.

In FIGURE 4 is shown the transmission characteristics of a conventional ultraviolet or "blue" reflecting coating. In FIGURE 5 I have shown a graph in which the coating shown in FIGURE 3 has been combined with the blue reflecting coating of FIGURE 4. This coating reflects sunlight or solar energy in the region below .4 micron and above 1.1 microns. Since the coating reflects sunlight on each side of these spectrally sensitive regions of the solar cell, that is, in the ultraviolet and near infrared regions, it can be called a "blue-red reflector." In one coating made in accordance with the present invention, it was found that out of the 23 percent of the solar energy above 1.1 microns, my coating reflected approximately one-half of this energy.

When such coatings indicated at 21 in FIGURE 7 are applied to glass covers or substrates 22 the average total emittance is increased. This is because glass is transparent in the response region of the silicon solar cell and yields a high value of emittance in the infrared. For that reason, the thin glass covers are often cemented to the top surface of a solar cell 23 by utilizing a thin transparent organic cement 24. However, in view of the fact that ultraviolet radiation causes such cements to darken, an ultraviolet reflecting filter 26 such as shown in the curve in FIGURE 4 is applied to the under surface of the glass to prevent degradation of the cement and to reduce the average solar absorptance of the cell.

It has been found by utilizing such a filter glass cover the average total emittance of the solar cell between 0 and 150° C. is increased to 0.85 to 0.90.

Although I have described my coatings as being applied to transparent substrates, the coatings, if desired, can be applied directly to the solar cell by vacuum deposition to provide a different assembly. Although the results so far obtained with such coatings is not comparable to the coatings applied to the glass covers, the results are a substantial improvement over uncovered cells.

Another use for my coating is for use as a wide band "hot" mirror or heat reflector. The conventional heat reflector which is well known to those skilled in the art is a 3:1 design which has a reflection band width from .75 to roughly 1.0 micron. If such a heat reflector is combined with my 4:1 coating it is possible to increase the reflection band beyond one micron without obstructing the visible band from .4 to .7 micron. That is, it should be possible to come up to 1.5 microns and to cover a band from .75 to 1.5 microns. Such an assembly is shown in the curve in FIGURE 6. With such a combination coating it can readily be seen that it is possible to reflect more infrared energy and thereby keep the device which you are protecting cooler than would otherwise be possible with conventional heat filters and still have full transmission in the visible region.

It is apparent from the foregoing that I have provided new and improved optical coating and assembly which has a very wide band of transmission in which the second and third order reflectivity bands have been removed. Because of the transmission band width, the coating is particularly adapted for use as a solar cell cover. It is also useful for general filter applications and for combining with conventional heat filter to provide an improved heat filter. The indices of refraction of the three coating materials required can be readily obtained from a formula which I have derived to make it relatively easy to choose the materials to be used in my new coating.

I claim:

1. An optical coating for a predetermined design wave length comprising a plurality of superimposed layers, said layers being formed of three different materials A, B and C, each of the materials having a different index of refraction, the layers being arranged to have a periodicity of ABCBA and each layer having an optical thickness of substantially one-quarter of the design wave length.

2. An optical coating as in claim 1 wherein said indices of refraction of said three materials A, B and C are $n_1$, $n_2$ and $n_3$ respectively and wherein the relationship between the indices of refraction is defined by the equation $$9.4722=\frac{n_2(n_3^2-n_1n_2)}{n_1n_3^2-n_2^3}$$

3. In a filter assembly for a predetermined design wavelength having a band pass from ultraviolet to near infrared, a transparent supporting body, a plurality of superimposed layers superposed on at least one of the surfaces of the supporting body, said layers being formed with three different materials A, B and C, each of the materials having a different index of refraction, the layers having a periodicity of ABCBA and each having an optical thickness of one-quarter of the design wavelength.

4. A filter assembly as in claim 3 wherein said three materials A, B and C have indices of refraction $n_1$, $n_2$ and $n_3$ respectively and wherein the relationship between the indices $n_1$, $n_2$ and $n_3$ is defined by the equation $$9.4722=\frac{n_2(n_3^2-n_1n_2)}{n_1n_3^2-n_2^3}$$

5. A filter assembly as in claim 3 together with an additional ultraviolet reflecting coating.

6. A filter assembly as in claim 3 together with a heat filter having a reflection ratio of 3:1.

7. In an optical coating having a predetermined design wavelength for use with a photosensitive device and having a transmission band substantially identical to the spectral response of the photosensitive device, the optical coating comprising a plurality of superposed layers adapted to be disposed adjacent said photosensitive device, said layers being formed of three different materials A, B and C, each of the materials having a different index of refraction, the layers being arranged to have a periodicity of ABCBA and having an optical thickness of one-quarter of the design wavelength.

8. In an assembly of the character described for a predetermined design wavelength, a photosensitive device having a predetermined spectral response, a cover of transparent material mounted over the photosensitive device, and an optical coating disposed on the cover and having a band pass substantially identical to the spectral response of the photosensitive device, the optical coating comprising a plurality of superposed layers disposed on one surface of the cover, the layers being formed of three different materials A, B and C, each of the materials having a different index of refraction, the layers being arranged to have a periodicity of ABCBA and each layer having an optical thickness of one-quarter of the design wavelength.

9. An assembly as in claim 8 wherein the three different materials A, B and C have indices of refraction $n_1$, $n_2$ and $n_3$ respectively, and wherein the relationship between the indices of refraction $n_1$, $n_2$ and $n_3$ is defined by the equation $$9.4722=\frac{n_2(n_3^2-n_1n_2)}{n_1n_3^2-n_2^3}$$

10. An assembly as in claim 8 wherein the glass cover is disposed adjacent the photosensitive device together with a transparent cement cementing the cover to the photosensitive device and an ultraviolet reflecting coating disposed on one surface of the transparent cover to protect the cement from ultraviolet.

11. In an assembly of the character described for a predetermined design wavelength, a photosensitive device, and an optical coating disposed on one surface of the photosensitive device, the optical coating comprising a plurality of superposed layers, said layers being formed of three different materials A, B and C, each of the materials having a different index of refraction, the layers being arranged to have a periodicity of ABCBA and having an optical thickness of one-quarter of the design wavelength.

12. An optical coating as in claim 11 wherein the three different materials A, B and C have indices of refraction $n_1$, $n_2$ and $n_3$ respectively, and wherein the relationship between the indices of refraction $n_1$, $n_2$, and $n_3$ is defined by the equation $$9.4722=\frac{n_2(n_3^2-n_1n_2)}{n_1n_3^2-n_2^3}$$

13. An optical coating for a predetermined design wave length comprising a plurality of superposed layers, said layers being formed of three different materials A, B and C having high, medium and low indices of refraction respectively, said layers being arranged in a periodic fashion to suppress second and third order reflection bands.

14. An optical coating as in claim 14 wherein the layers are arranged to have a periodicity of ABCBA and wherein the layers have an optical thickness of substantially one-quarter of the design wavelength.

15. An optical coating as in claim 13 wherein said indices of refraction of said three materials A, B and C are $n_1$, $n_2$ and $n_3$ respectively and wherein the relationship between the indices of refraction is defined by the equation $$9.4722=\frac{n_2(n_3^2-n_1n_2)}{n_1n_3^2-n_2^3}$$

16. An optical coating for a predetermined design wave length comprising a plurality of superposed layers, said layers being formed of more than two different materials and being arranged in a periodic fashion, said layers creating reflectance bands which are separated by a ratio of 4:1 in peak wave lengths with substantially uniform high transmittance between the reflectance bands.

17. An optical coating as in claim 16 wherein three different materials A, B and C are utilized and wherein the three different materials have high, medium and low indices of refraction respectively.

18. An optical coating as in claim 17 wherein said layers are arranged to have a periodicity of ABCBA and have an optical thickness of substantially one-quarter of the design wavelength.

19. An optical coating as in claim 18 wherein said indices of refraction of said materials A, B and C are $n_1$, $n_2$ and $n_3$ respectively, and wherein the relationship between the indices of refraction is defined by the equation $$9.4722=\frac{n_2(n_3^2-n_1n_2)}{n_1n_3^2-n_2^3}$$

20. In assembly of the character described for a predetermined design wavelength, a photosensitive device, a cover of transparent material mounted over the photosensitive device, an optical coating disposed on the cover, the optical coating comprising a plurality of superposed layers, said layers being formed of more than three different materials A, B and C having high, medium and low indices of refraction respectively, the layers being arranged in a periodic fashion to suppress the second and third order reflection bands.

21. In an assembly of the character described for a predetermined design wavelength, a photosensitive device, a cover of transparent material mounted over the photosensitive device, and an optical coating disposed on the cover, the optical coating comprising a plurality of superposed layers, said layers being formed of more than two different materials and being arranged in a periodic fashion, said layers creating reflectance bands which are separated by a ratio of 4:1 in peak wavelengths with substantially uniform high transmittance between the reflectance bands.

22. A filter assembly for a predetermined design wavelength and having a band pass from ultra-violet to near infra-red, a transparent supporting body, a plurality of superposed layers disposed on at least one surface of the supporting body, and an ultra-violet reflecting coating disposed on at least one of the surfaces of the supporting body, said superposed layers being formed of three different materials A, B and C, each of the materials having a different index of refraction, each of said layers having an optical thickness of one-quarter of the design wavelength, said layers being arranged to have a periodicity of ABCBA.

23. A filter assembly as in claim 22 in which the layers have a transmittance from .4 to 1.1 microns and in which the ultra-violet reflecting coating reflects sunlight below .4 micron and above 1.1 microns.

24. A filter assembly for a predetermined design wavelength and having a band pass from ultra-violet to the near infra-red, a transparent supporting body, a plurality of superposed layers disposed on at least one surface of the supporting body, and a heat reflecting coating disposed on one of the surfaces of the supporting body, said superposed layers being formed of three different materials A, B and C, each of the materials having a different index of refraction, and each layer having an optical thickness of one-quarter of the design wavelength, said layers being arranged to have a periodicity of ABCBA.

25. A filter assembly as in claim 24 in which the layers have a transmittance from .4 to 7 microns and in which the heat reflecting coating has a reflection band width from .75 to approximately 1.5 microns.

References Cited by the Examiner

UNITED STATES PATENTS

| | | | |
|---|---|---|---|
| 1,615,448 | 1/1927 | Frank | 250—86 |
| 2,531,000 | 11/1950 | Scott | 250—86 |
| 2,624,238 | 1/1953 | Widdop et al. | 88—106 |
| 2,668,478 | 2/1954 | Schroder | 88—106 |
| 2,852,980 | 9/1958 | Schroder | 88—106 |
| 2,900,523 | 8/1959 | Ruzicka | 250—211 |
| 3,076,861 | 2/1963 | Samulon et al. | 250—226 X |
| 3,118,063 | 1/1964 | Kaufman | 88—106 |
| 3,123,490 | 3/1964 | Bolomey et al. | 88—106 |

OTHER REFERENCES

Barchewitz, "Systems Filtrants a Couches Multiples Utilises En Infrarouge," L'Onde Electrique, November 1959, pages 845 to 853.

Epstein, "Improvements in Heat-Reflecting Filters," Journal of the Optical Society of America, May 1955, pages 360 to 362.

Sokolova, "Interference Filters for the Ultraviolet Region of the Spectrum," Optika I Spektroskopiia (Optics and Spectroscopy), June 1959, pages 513 to 515.

RALPH G. NILSON, *Primary Examiner.*